United States Patent
Mori

(10) Patent No.: US 10,418,075 B2
(45) Date of Patent: Sep. 17, 2019

(54) BIT LINE POWER SUPPLY APPARATUS

(71) Applicant: Winbond Electronics Corp., Taichung (TW)

(72) Inventor: Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/261,460

(22) Filed: Jan. 29, 2019

(65) Prior Publication Data

US 2019/0252006 A1 Aug. 15, 2019

(30) Foreign Application Priority Data

Feb. 9, 2018 (JP) .................................. 2018/022365

(51) Int. Cl.
*G11C 5/14* (2006.01)
*H03K 3/356* (2006.01)

(52) U.S. Cl.
CPC .............. *G11C 5/147* (2013.01); *G11C 5/145* (2013.01); *G11C 5/148* (2013.01); *H03K 3/356113* (2013.01)

(58) Field of Classification Search
CPC ......... G11C 5/145; G11C 5/147; G11C 5/148; H03K 3/356113
See application file for complete search history.

(56) References Cited

U.S. PATENT DOCUMENTS

| | | | |
|---|---|---|---|
| 6,636,023 B1 | 10/2003 | Amin | |
| 6,930,938 B2 * | 8/2005 | Yasuda | G11C 29/02 365/190 |
| 7,417,903 B2 * | 8/2008 | Kim | G11C 5/147 365/189.09 |
| 7,639,067 B1 | 12/2009 | Perisetty | |
| 7,738,928 B2 | 6/2010 | Veselic | |
| 9,285,814 B1 | 3/2016 | Agarwal | |
| 9,710,050 B2 * | 7/2017 | Segawa | G06F 1/3268 |
| 2010/0191987 A1 | 7/2010 | Furutani et al. | |

(Continued)

FOREIGN PATENT DOCUMENTS

| | | |
|---|---|---|
| CN | 103633841 | 3/2014 |
| JP | 2010176742 | 8/2010 |

(Continued)

*Primary Examiner* — Harry W Byrne
*Assistant Examiner* — R Lance Reidlinger
(74) *Attorney, Agent, or Firm* — JCIPRNET

(57) ABSTRACT

A bit line power supply apparatus including a bit line high voltage generator is provided. The bit line high voltage generator includes a first voltage generation circuit and a second voltage generation circuit. The first voltage generation circuit includes a first sensor and a first linear voltage regulator. The first sensor compares a first reference voltage with a bit line high voltage to generate a first sensing voltage according to a first control signal. The first linear regulator generates the bit line high voltage according the first sensing voltage. The second voltage generation circuit includes a second sensor and a switching voltage regulator. The second sensor compares the first reference voltage with the bit line high voltage to generate a second sensing voltage according to a second control signal. The switching regulator generates the bit line high voltage according the second sensing voltage.

15 Claims, 9 Drawing Sheets

(56) References Cited

U.S. PATENT DOCUMENTS

2011/0080797 A1    4/2011   Furutani
2012/0275256 A1   11/2012   Furutani et al.

FOREIGN PATENT DOCUMENTS

| JP | 2011081855 | 4/2011 |
|----|------------|--------|
| JP | 2012190495 | 10/2012 |
| JP | 2012230737 | 11/2012 |
| JP | 2015533443 | 11/2015 |
| TW | 201108589 | 3/2011 |

* cited by examiner

BIT LINE POWER SUPPLY APPARATUS

CROSS-REFERENCE TO RELATED APPLICATION

This application claims the priority benefit of Japan application serial no. 2018-022365, filed on Feb. 9, 2018. The entirety of the above-mentioned patent application is hereby incorporated by reference herein and made a part of this specification.

BACKGROUND

Technical Field

The invention relates to a bit line power supply apparatus, and particularly relates to a bit line power supply apparatus having a linear voltage regulator and a switching voltage regulator.

Description of Related Art

A conventional low power Double-Data-Rate Three Synchronous Dynamic Random Access Memory (DDR3) may have two external voltages, which are usually 1.8 V and 1.2 V. Generally, allowed current consumption of the relatively high external voltage is lower than that of the relatively low external voltage, so that an overdrive voltage for a sensing amplifier in the DRAM is generally generated by the relatively low external voltage.

Since the overdrive voltage is higher than the relatively low external voltage, generating the overdrive voltage cannot be achieved by a voltage regulator alone and requires a boost operation of a charge pump circuit in collaboration with the relatively low external voltage. However, voltage conversion efficiency of the charge pump circuit is lower than that of the voltage regulator, which causes increase of the current consumption of the relatively low external voltage. Moreover, in a conventional memory refresh operation, the overdrive voltage is still supplied to the sensing amplifier, which results in increase of the current consumption of the refresh operation. On the other hand, although a sensing amplifier of another conventional memory may complete operations without using the overdrive voltage, it takes more time for read and write operations compared to the situation adopting the overdrive voltage. Moreover, activating such sensing amplifier requires a bit line high voltage, which is liable to have a voltage drop problem when the bit line high voltage supplied to all of the sensing amplifiers. In order to mitigate such voltage drop problem, a larger regulator for the bit line high voltage is required to be configured.

SUMMARY

The invention is directed to a bit line power supply apparatus to supply power to a bit line in a memory and ameliorate a regulator for a bit line high voltage.

The invention provides a bit line power supply apparatus adapted to a memory and including a bit line high voltage generator configured to generate a bit line high voltage. The bit line high voltage generator includes a first voltage generation circuit and a second voltage generation circuit. The first voltage generation circuit includes a first sensor and a first linear voltage regulator. The first sensor receives a first control signal and is enabled by the first control signal, and compares a first reference voltage with the bit line high voltage to generate a first sensing voltage, and a power supply voltage of the first sensor is a first voltage. The first linear voltage regulator is coupled to the first sensor, and performs linear adjustment on the first sensing voltage to generate a first output voltage, and a power supply voltage of the first linear voltage regulator is a second voltage. The second voltage generation circuit is coupled in parallel with the first voltage generation circuit, and includes a second sensor and a switching voltage regulator. The second sensor receives a second control signal and is enabled by the second control signal, and compares the first reference voltage with the bit line high voltage to generate a second sensing voltage, and a power supply voltage of the second sensor is a third voltage. The switching voltage regulator is coupled to the second sensor, and performs switching adjustment according to the second sensing voltage to generate a second output voltage, and a power supply voltage of the switching voltage regulator is the second voltage, wherein the bit line power supply apparatus combines the first output voltage and the second output voltage to generate the bit line high voltage, the first voltage is greater than the third voltage, and the third voltage is greater than the second voltage.

Based on the above description, in some embodiments of the invention, after the sensing amplifier is activated for a period of time, the second control signal is decreased to a low logic level to turn off the second voltage generation circuit, such that only the first voltage generation circuit provides the voltage to reduce the current consumption of the bit line power supply apparatus. In some embodiments of the invention, the bit line power supply apparatus may turn off the overdrive voltage generator with relatively low efficiency during the refresh operation, and only use the bit line high voltage generator with relatively high efficiency to output, so as to reduce the current consumption during the refresh operation. In an activation operation, the bit line high voltage generator and the overdrive voltage generator are simultaneously activated, such that the activation operation has a fast random access time, and the overdrive voltage generator and the switching voltage regulator are sequentially turned off, so that the activation operation has smaller current consumption.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
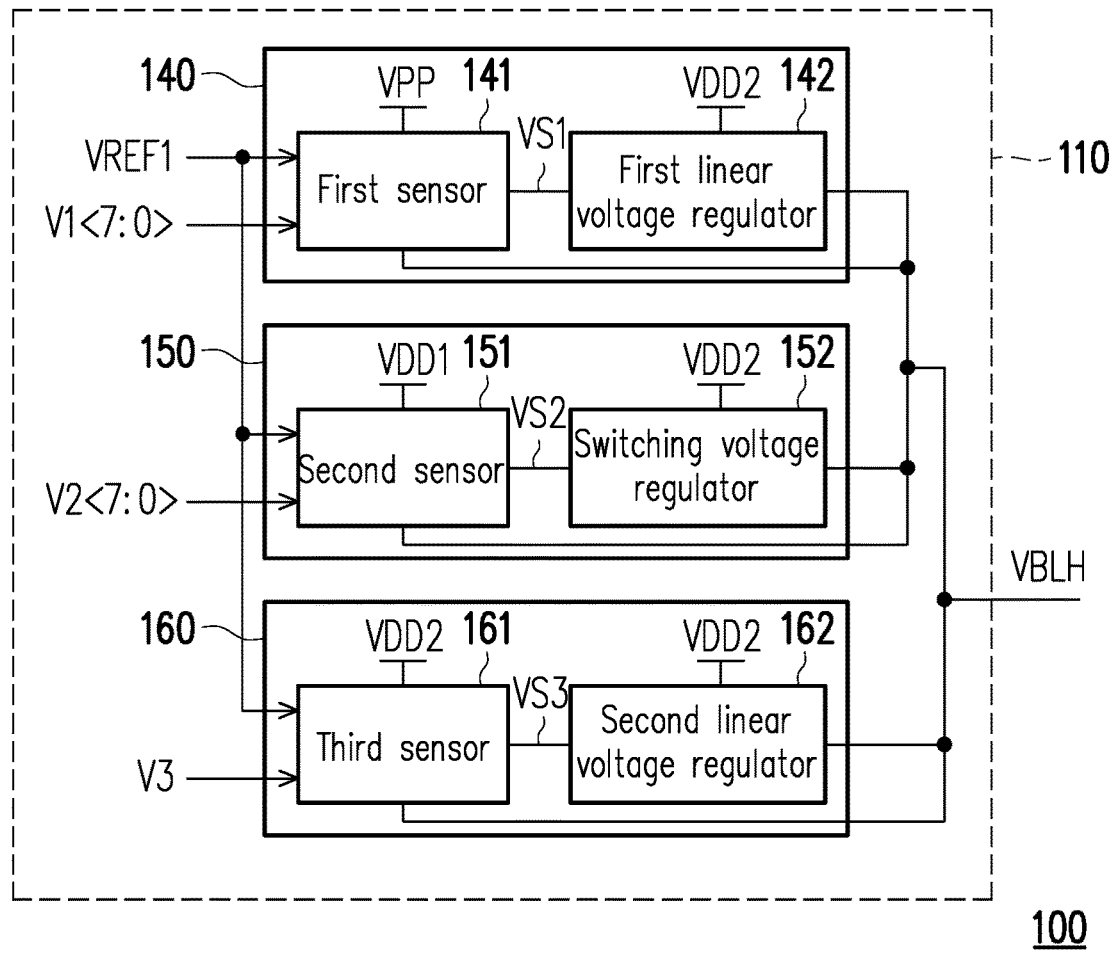
FIG. 1 is a block diagram of a bit line power supply apparatus according to an embodiment of the invention.

Referring to FIG. 1, the bit line power supply apparatus 100 includes a bit line high voltage generator 110, which is configured to generate a bit line high voltage VBLH. The bit line high voltage VBLH may be supplied to a sensing amplifier (not shown), and may be applied to a write operation. The bit line high voltage generator 110 includes a first voltage generation circuit 140 and a second voltage generation circuit 150 connected in parallel with the first voltage generation circuit 140. The first voltage generation circuit 140 and the second voltage generation circuit 150 construct one bit line high voltage generation unit. Each bit line high voltage generation unit corresponds to a memory bank. In the embodiment, a memory has 8 memory banks, and the bit line high voltage generator 110 is configured with 8 bit line high voltage generation units. The first voltage generation circuit 140 receives a first reference voltage VREF1 and a first control signal V1<7:0>, the second voltage generation circuit 150 receives the first reference voltage VREF1 and a second control signal V2<7:0>, and the first voltage generation circuit 140 and the second voltage generation circuit 150 jointly generate the bit line high voltage VBLH. A bit number of the aforementioned control signal corresponds to the number of the memory banks, and may be set according to an actual requirement, and is not limited by the invention. The aforementioned control signal is configured to point to a specific bank or all of the memory banks.

The first voltage generation circuit 140 includes a first sensor 141 and a first linear voltage regulator 142. In the embodiment, the first sensor 141 receives the first control signal V1<7:0>, where the first control signal V1<7:0>, for example, corresponds to the 8 memory banks of the memory. In the embodiment, the first sensor 141 enabled according to the first control signal V1<7:0> compares the first reference voltage VREF1 with the bit line high voltage VBLH, and generates a first sensing voltage VS1 according to a comparison result. The first linear voltage regulator 142 is coupled to the first sensor 141 to receive the first sensing voltage VS1, and performs linear adjustment on the first sensing voltage VS1 to generate a first output voltage. A power supply voltage supplied to the first sensor 141 is a first voltage VPP (for example, 2.8 V), and a power supply voltage supplied to the first linear voltage regulator 142 is a second voltage VDD2 (for example, 1.2 V) smaller than the first voltage VPP.

The second voltage generation circuit 150 includes a second sensor 151 and a switching voltage regulator 152. In the embodiment, the second sensor 151 receives the second control signal V2<7:0>. The second control signal V2<7:0>, for example, corresponds to the 8 memory banks of the memory. In the embodiment, the second sensor 151 enabled according to the second control signal V2<7:0> compares the first reference voltage VREF1 with the bit line high voltage VBLH to generate a comparison result, and generates a second sensing voltage VS2 according to the comparison result. The switching voltage regulator 152 receives the second sensing voltage VS2, and performs switching adjustment on a third voltage VDD1 according to the second sensing voltage VS2, so as to generate a second output voltage. The bit line power supply apparatus 100 combines the first output voltage and the second output voltage to generate the bit light high voltage VBLH. In the embodiment, a power supply voltage of the second sensor 151 is the third voltage VDD1 (for example, 1.8 V), and a power supply voltage of the switching voltage regulator 152 is the second voltage VDD2 smaller than the third voltage VDD1.

In the exemplary embodiment, the bit line power supply apparatus 100 may further include a first standby voltage circuit 160. The first standby voltage circuit 160 is connected in parallel with the first voltage generation circuit 140 and the second voltage generation circuit 150, and is enabled based on a first standby voltage circuit control signal V3. The enabled first standby voltage circuit 160 compares the first reference voltage VREF1 with the bit line high voltage VBLH, and generates the bit line high voltage VBLH according to a comparison result. The first standby voltage circuit 160 is configured to provide the bit line high voltage VBLH in a standby mode or other low power mode. Therefore, current consumption of the first standby voltage circuit 160 is smaller compared to that of the first voltage generation circuit 140 and the second voltage generation circuit 150.

The first standby voltage circuit 160 includes a third sensor 161 and a second linear voltage regulator 162. In the embodiment, the third sensor 161 may be an error amplifier, which receives the first standby voltage circuit control signal V3 and is enabled by the same to compare the first reference voltage VREF1 with the bit line high voltage VBLH fed back by an output terminal of the second linear voltage regulator 162, and generates a third sensing voltage VS3 according to a comparison result. The second linear voltage regulator 162 is coupled to the third sensor 161 to receive the third sensing voltage VS3, and is configured to perform linear regulation on the third sensing voltage VS3 to generate the bit line high voltage VBLH. In the embodiment, the second linear voltage regulator 162 and the first linear voltage regulator 142 are linear regulators. Power supply voltages of the third sensor 161 and the second linear voltage regulator 162 are all the second voltage VDD2. In other embodiments, the power supply voltages of the third sensor 161 and the second linear voltage regulator 162 may all be set to the third voltage VDD1.

Figure 2:
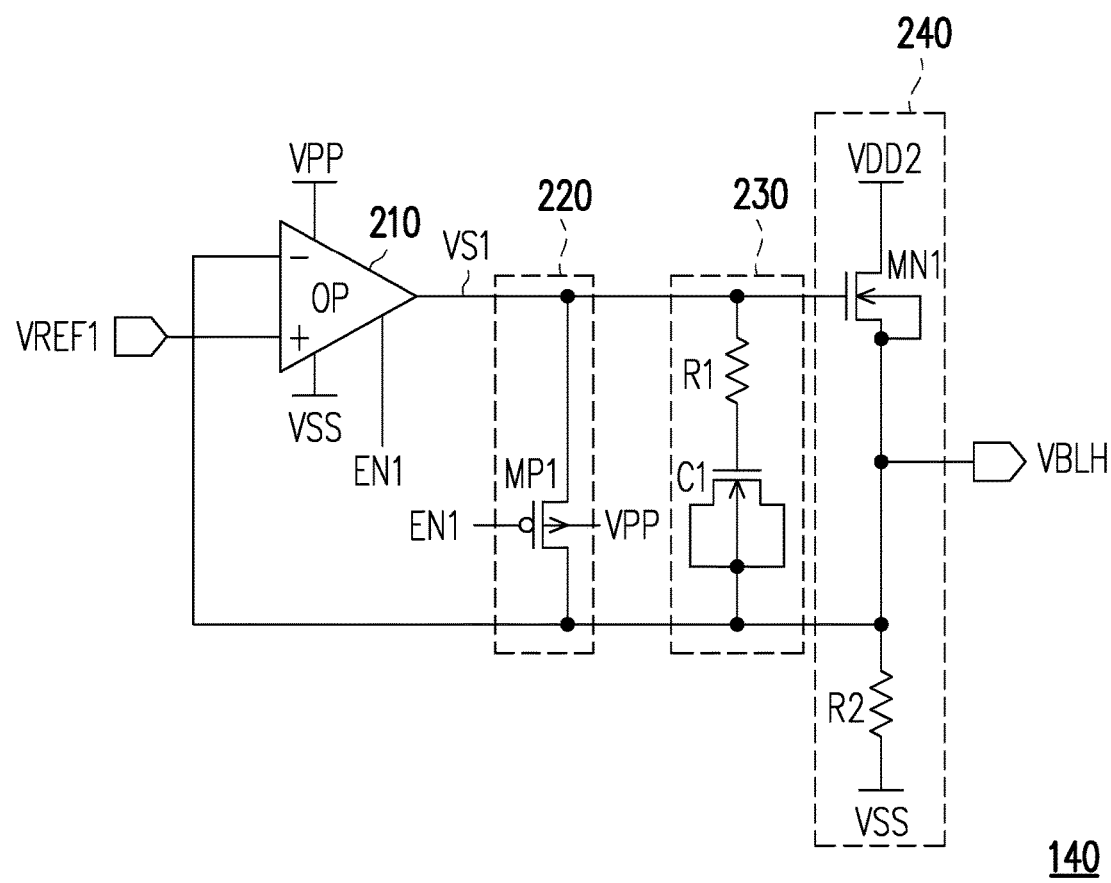
FIG. 2 is a schematic diagram of a first voltage generation circuit according to an embodiment of the invention.

Referring to FIG. 2, FIG. 2 is a schematic diagram of the first voltage generation circuit 140 according to an embodiment of the invention. The first sensor 141 may include an operational amplifier 210, and the first linear voltage regulator 142 may include a switch 220, a resistance-capacitance string 230, and an output stage 240. The operational amplifier 210 may serve as the error amplifier. A first input terminal of the operational amplifier 210 receives the first reference voltage VREF1, and a second input terminal of the operational amplifier 210 receives the bit line high voltage VBLH, and the operational amplifier 210 is enabled by an enable signal EN1. The enable signal EN1 is a logic signal, and is generated according to the first control signal V1<7:0>. When the first control signal V1<7:0> indicates accessing of the memory bank corresponding to the first voltage generation circuit 140, the operational amplifier 210 may be enabled according to the enable signal EN1 corresponding to the first control signal V1<7:0>. Moreover, the enabled operational amplifier 210 compares the first reference voltage VREF1 and the bit line high voltage VBLH to obtain a comparison result, and generates the first sensing voltage VS1 according to the comparison result. The comparison result is a voltage difference between the first reference voltage VREF1 and the bit line high voltage VBLH. A first terminal of the switch 220 is coupled to an output terminal of the operational amplifier 210, and a second terminal thereof is coupled to the second input terminal of the operational amplifier 210 (i.e. an output terminal of the first linear voltage regulator 142). In the embodiment, the switch 220 includes a P-type transistor MP1. A gate of the transistor MP1 receives the enable signal EN1, and the transistor MP1 is turned on or turned off according to the enable signal EN1. When the operational amplifier 210 is enabled according to the enable signal EN1, the switch 220 is correspondingly turned off. Comparatively, when the operational amplifier 210 is disabled according to the enable signal EN1, the switch 220 is correspondingly turned on. When the switch 220 is turned on, the first sensing voltage VS1 and the bit line high voltage VBLH may be equalized to a same voltage value.

The resistance-capacitance string 230 is coupled between the output terminal of the operational amplifier 210 and the second input terminal of the operational amplifier 210, the resistance-capacitance string 230 includes a resistor R1 and a capacitor C1 connected in series, and is configured to perform phase compensation on the first sensing voltage VS1. The output stage 240 includes an N-type transistor MN1 and a resistor R2, where a gate of the transistor MN1 is coupled to the output terminal of the operational amplifier 210, and the transistor MN1 is controlled by the first sensing voltage VS1 to output the bit line high voltage VBLH. Moreover, the N-type transistor MN1 is a transistor with a deep N-well, and a bulk terminal of the N-type transistor MN1 is coupled to a source of the N-type transistor MN1, and has a clamping function on the bit line high voltage VBLH. The output stage 240 feeds back the bit line high voltage VBLH to the second input terminal of the operational amplifier 210. Under a stable state, the voltage of the bit line high voltage VBLH may approach the first reference voltage VREF1. A power supply voltage of the operational amplifier 210 is the first voltage VPP, and a power supply voltage of the output stage 240 is the second voltage VDD2.

Figure 3:
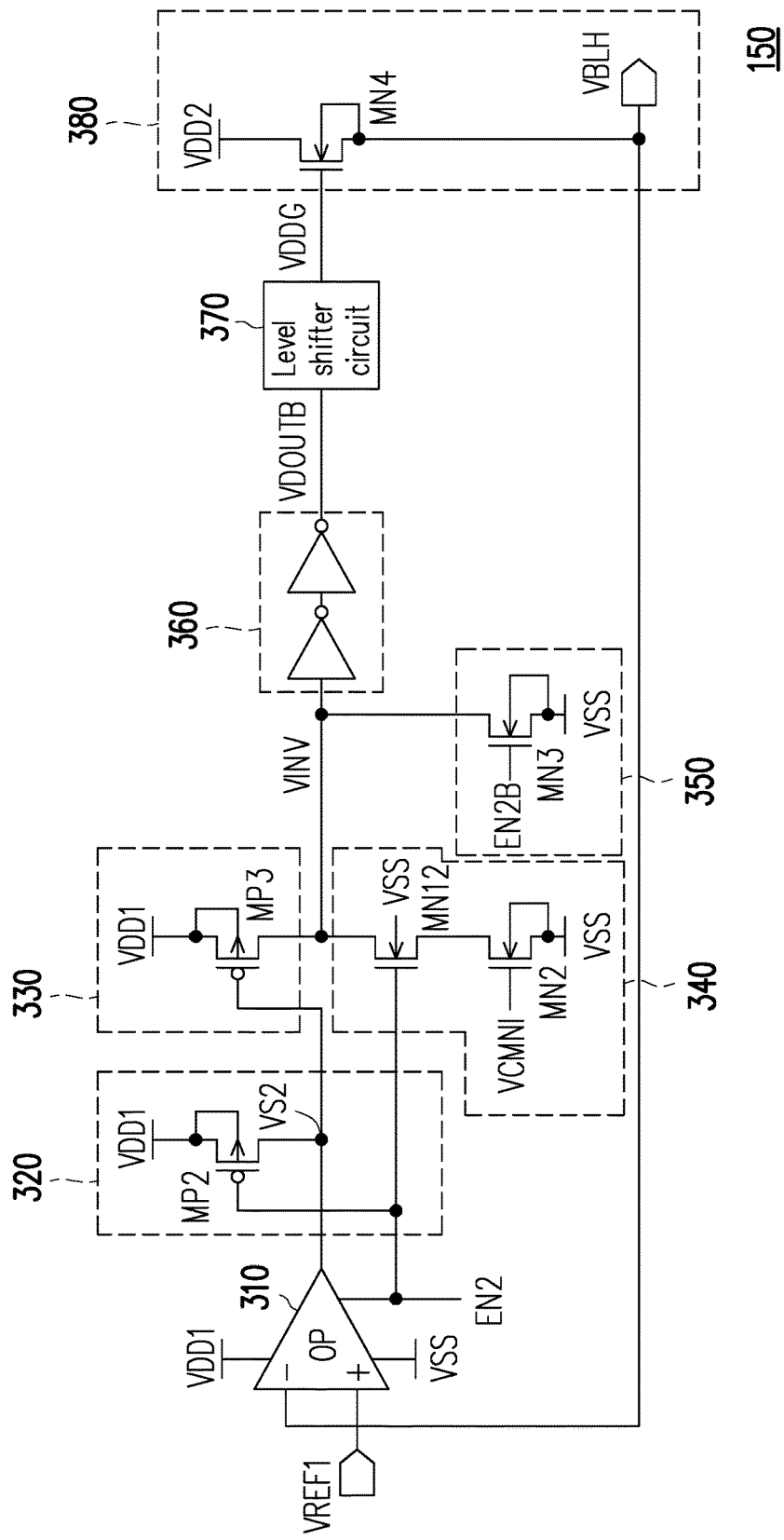
FIG. 3 is a schematic diagram of a second voltage generation circuit according to an embodiment of the invention.

Referring to FIG. 3, in an embodiment of the invention, the second sensor 151 of the second voltage generation circuit 150 includes an operational amplifier 310, and the switching voltage regulator 152 of the second voltage generation circuit 150 includes a switch 320, a pull-up switch 330, a reference current generator 340, a switch 350, a buffer 360, a level shifter circuit 370 and an output stage 380. In the embodiment, the operational amplifier 310 serves as the error amplifier, and receives an enable signal EN2 and is enabled by the same, where the enable signal EN2 is a logic signal, and is generated according to the second control signal V2<7:0>. The enabled operational amplifier 310 compares the first reference voltage VREF1 with the bit line high voltage VBLH, and generates the second sensing voltage VS2 according to the voltage difference between the first reference voltage VREF1 and the bit line high voltage VBLH.

A first terminal of the switch 320 is coupled to an output terminal of the operational amplifier 310, and a second terminal thereof is coupled to the third voltage VDD1. The switch 320 includes a P-type transistor MP2, and a gate of the transistor MP2 receives the enable signal EN2, and the transistor MP2 is turned on when the operational amplifier 310 is disabled, such that the second sensing voltage VS2 is equal to the third voltage VDD1 to avoid a voltage floating problem. The pull-up switch 330 is coupled to the output terminal of the operational amplifier 310, and receives the third voltage VDD1 through a first terminal of the pull-up switch 330 (a source of the P-type transistor MP3). The pull-up switch 330 is composed of the P-type transistor MP3. A gate of the pull-up switch 330 receives the second sensing voltage VS2, and the pull-up switch 330 is turned on or off according to the second sensing voltage VS2. When the pull-up switch 330 is turned on, a voltage level of a second terminal of the pull-up switch 330 is pulled high according to the third voltage VDD1.

The reference current generator 340 is coupled to the pull-up switch 330, and the reference current generator 340 includes an N-type transistor MN12 and an N-type transistor MN2. A gate of the N-type transistor MN2 is controlled by a bias voltage VCMNI to connect the N-type transistor MN12 to a ground terminal VSS, so that the N-type transistor MN2 may be regarded as a current source. A gate of the N-type transistor MN12 is controlled by the enable signal EN2, and when the N-type transistor MN12 is turned on, the second terminal of the pull-up switch 330 (i.e. a drain of the P-type transistor MP3) generates a reference current to the ground terminal VSS. In the embodiment, a voltage (i.e. a switch voltage VINV) on the second terminal of the pull-up switch 330 is determined according to a pull-up strength of the pull-up switch 330 and a magnitude of the reference current, where the pull-up strength of the pull-up switch 330 is determined by the third voltage VDD1 and the second sensing voltage VS2. Then, the sensing voltage VS2 belonging to an analog signal is converted into a digital signal through the buffer 360. Compared to the analog signal, a reversal threshold of the digital signal may be adjusted, and the digital signal may not be substantially changed by changes in a threshold voltage of the transistor and environment temperature.

The switch 350 is coupled between the second terminal of the pull-up switch 330 and the ground terminal VSS. The switch 350 is an N-type transistor MN3. The transistor MN3 receives an enable signal EN2B through its gate, and couples the second terminal of the pull-up switch 330 to the ground terminal VSS when the operational amplifier 310 is disabled, such that the switch voltage VINV is pulled down to a ground voltage to avoid the voltage floating problem. The buffer 360 and the level shifter circuit 370 are sequentially connected to the second terminal of the pull-up switch 330 in series for improving current driving capability and providing a level shift function. The buffer 360 generates a buffer voltage VDOUTB according to the voltage on the second terminal of the pull-up switch 330, and the level shifter circuit 370 receives the buffer voltage VDOUTB, and shifts the buffer voltage VDOUTB to generate a gate control voltage VDDG. In an embodiment, the level shifter circuit 370 is configured to shift the buffer voltage VDOUTB between the third voltage VDD1 and the ground terminal VSS to a voltage between the first voltage VPP and the bit line high voltage VBLH. The output stage 380 is coupled to an output of the level shifter circuit 370. The output stage 380 includes an N-type transistor MN4, which is controlled by the gate control voltage VDDG to output the second output voltage serving as the bit line high voltage VBLH, and feeds back the bit line high voltage VBLH to the second input terminal of the operational amplifier 310, such that a target voltage of the bit line high voltage VBLH may approach the first reference voltage VREF1.

Figure 4:
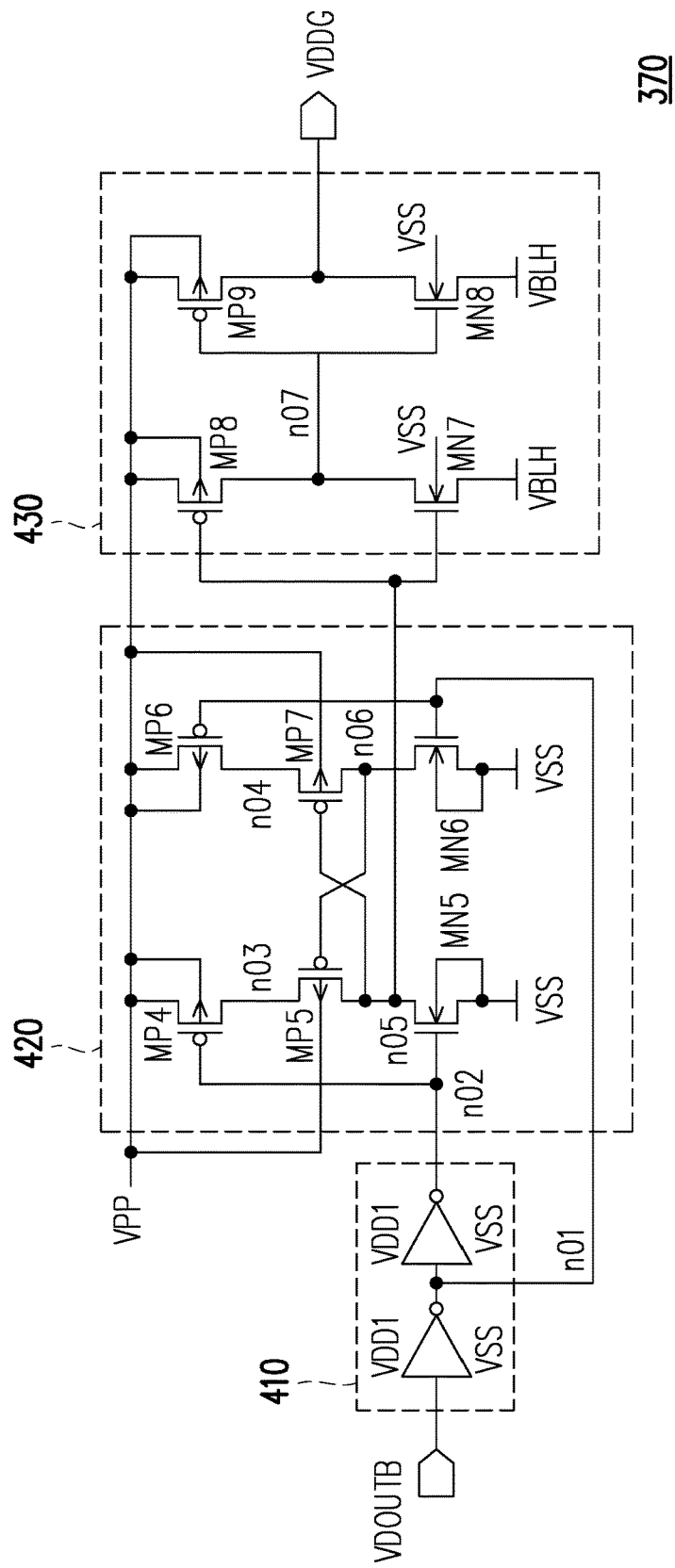
FIG. 4 is a schematic diagram of a level shifter circuit according to an embodiment of the invention.

Referring to FIG. 4, the level shift circuit 370 of an embodiment of the invention includes a buffer 410, a level shifter 420 and a buffer 430. The level shifter 420 is coupled between the buffer 410 and the buffer 430. The buffer 410 includes two inverters, which are coupled between the third voltage VDD1 and the ground terminal VSS. The buffer 410 receives the buffer voltage VDOUTB for enhancing a current drivability, and provides a first potential having the same phase with the buffer voltage VDOUTB to a node voltage n02 and provides a second potential having the phase opposite to the buffer voltage VDOUTB to a node voltage n01. The level shifter 420 includes four P-type transistors MP4, MP5, MP6 and MP7, and two N-type transistors MN5 and MN6. A drain of the P-type transistor MP4 and a source of the P-type transistor MP5 are connected to a node voltage n03, and a drain of the P-type transistor MP6 and a source of the P-type transistor MP7 are connected to a node voltage n04. A node voltage n05 and a node voltage n06 are configured between the P-type transistor MP5 and the N-type transistor MN5. The level shifter 420 has a cross-coupling structure, where a gate of the P-type transistor MP5 is coupled to a drain of the P-type transistor MP7, and a gate of the P-type transistor MP7 is coupled to a drain of the P-type transistor MP5. The node voltage n01 between the two inverters of the buffer 410 is coupled to a gate of the N-type transistor MN6 in the level shifter 420, and the node voltage n02 of the buffer 410 is coupled to the gates of the P-type transistor MP4 and the N-type transistor MN5 in the level shifter 420. The level shifter 420 is coupled between the first voltage VPP and the ground terminal VSS. The level shifter 420 receives the node voltage n01 and the node voltage n02 to perform level shifting. The buffer 430 is composed of two inverters, and includes two P-type transistors MP8 and MP9, and two N-type transistors MN7 and MN8, where the two inverters are connected to a node voltage n07. The buffer 430 receives the node voltage n05, and is coupled between the first voltage VPP and the bit line high voltage VBLH, and outputs the gate control voltage VDDG. The buffer 430 is used for enhancing the current drivability and assisting the level shifter circuit 370 to perform level shifting. Moreover, the N-type transistor MN4 is a transistor with a deep N-well.

Figure 5:
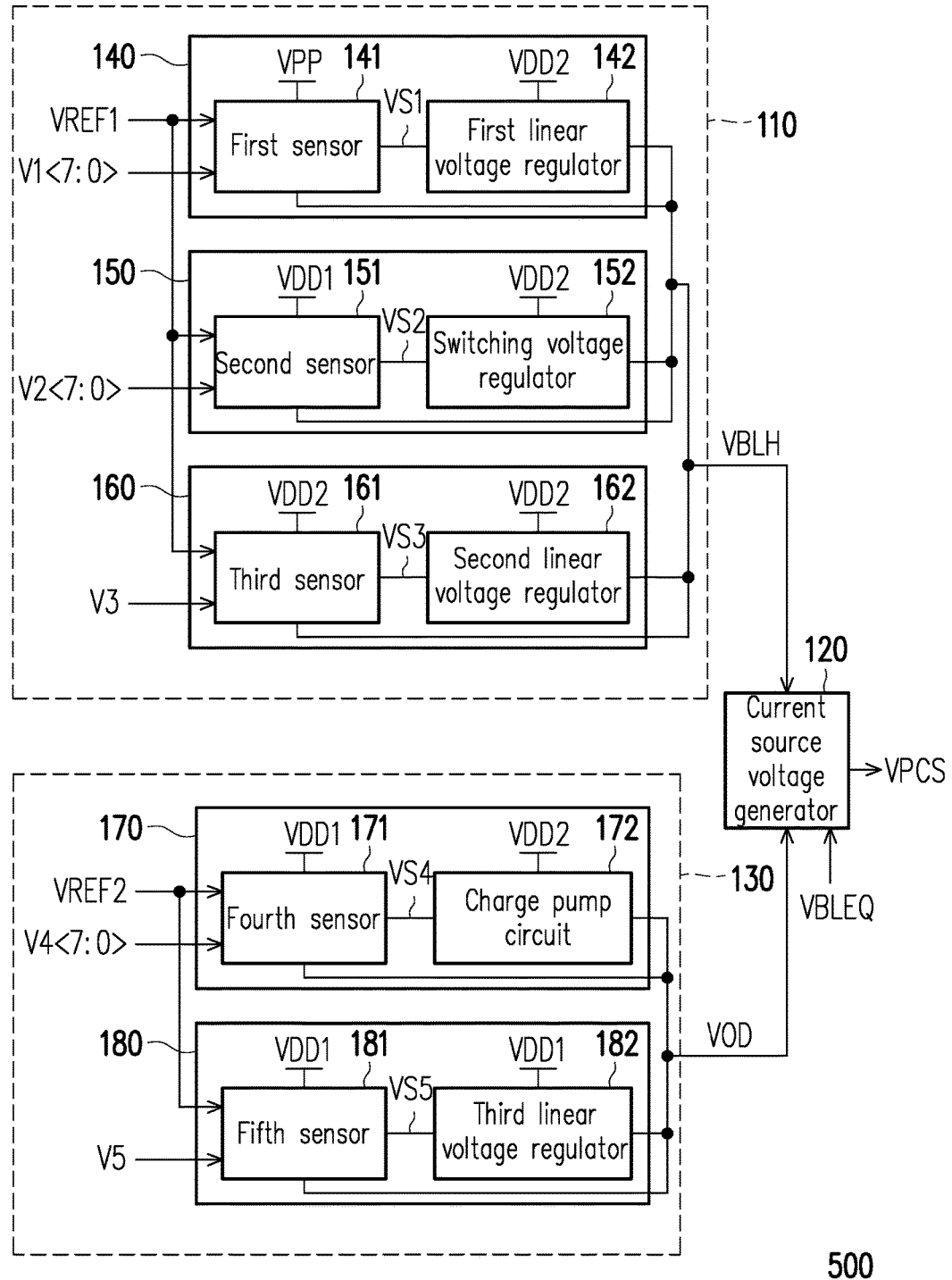
FIG. 5 is a block diagram of a bit line power supply apparatus according to another embodiment of the invention.

Referring to FIG. 5, FIG. 5 is a bit line power supply apparatus according to another embodiment of the invention. In the embodiment, the bit line power supply apparatus 500 includes the bit line high voltage generator 110, a current source voltage generator 120 and an overdrive voltage generator 130. The bit line high voltage generator 110 has been described in the embodiments of FIG. 1 to FIG. 4, and detail thereof is not repeated. The current source voltage generator 120 is coupled to the bit line high voltage generator 110 and the overdrive voltage generator 130 to respectively receive the bit line high voltage VBLH and an overdrive voltage VOD, and the current source voltage generator 120 generates a current source voltage VPCS according to the bit line high voltage VBLH, the overdrive voltage VOD and a bit line equalization voltage VBLEQ. The bit line equalization voltage VBLEQ is used to enable the bit line to be quickly precharged, and the current source voltage VPCS is provided to a P-type transistor (not shown) of a sensing amplifier.

In the embodiment, the overdrive voltage generator 130 includes a third voltage generation circuit 170 and a second standby voltage circuit 180 connected in parallel with each other. In the embodiment, the overdrive voltage generator 130 is configured with 8 third voltage generation circuits 170, and each of the third voltage generation circuits 170 corresponds to a memory bank. The third voltage generation circuit 170 receives a second reference voltage VREF2 and a third control signal V4<7:0>, and the second standby voltage circuit 180 receives the second reference voltage VREF2 and a second standby voltage circuit control signal V5, and the third voltage generation circuit 170 and the second standby voltage circuit 180 are configured to generate the overdrive voltage VOD. The overdrive voltage VOD may be provided to the sensing amplifier. The overdrive voltage VOD is greater than the bit line high voltage VBLH.

The third voltage generation circuit 170 includes a fourth sensor 171 and a charge pump circuit 172. In the embodiment, the fourth sensor 171 is an error amplifier, and the fourth sensor 171 is enabled according to the third control signal V4<7:0>, and compares the second reference voltage VREF2 with the overdrive voltage VOD, and generates a fourth sensing voltage VS4 according to a comparison result. The third control signal V4<7:0> is, for example, adapted to respectively control the 8 memory banks of the memory, and the number of the memory banks of the memory is not limited by the invention. The fourth sensor 171 is similar to the aforementioned first sensor 141, and detail thereof is not repeated. The charge pump circuit 172 is coupled to the fourth sensor 171 to boost the received fourth sensing voltage VS4, so as to generate the overdrive voltage VOD, where the overdrive voltage VOD is greater than or equal to the fourth sensing voltage VS4. In the embodiment, the charge pump circuit 172 may be a DC-DC converter, though the circuit structure of the charge pump circuit 172 is not limited by the invention. A power supply voltage of the fourth sensor 171 is the third voltage VDD1, and a power supply voltage of the charge pump circuit 172 is the second voltage VDD2.

The second standby voltage circuit 180 includes a fifth sensor 181 and a third linear voltage regulator 182. In the embodiment, the fifth sensor 181 is an error amplifier. The fifth sensor 181 receives the second reference voltage VREF2 and the feedback overdrive voltage VOD, and is enabled according to a second standby voltage circuit control signal V5. The enabled fifth sensor 181 compares the second reference voltage VREF2 and the overdrive voltage VOD to obtain a comparison result, and generates a fifth sensing voltage VS5 according to the comparison result. The comparison result is a voltage difference between the second reference voltage VREF2 and the overdrive voltage VOD. The fifth sensor 181 is similar to the aforementioned third sensor 161, and detail thereof is not repeated. The third linear voltage regulator 182 is coupled to the output of the fifth sensor 181 to perform linear regulation on the fifth sensing voltage VS5, so as to generate the overdrive voltage VOD. In the embodiment, the third linear voltage regulator 182 is similar to the second linear voltage regulator 162, and is also a linear regulator, which is not repeated. Power supply voltages of the fifth sensor 181 and the third linear voltage regulator 182 are all the third voltage VDD1.

It should be noted that in another embodiment of the invention, the current source voltage generator 120 may be only coupled to the bit line high voltage generator 110 to generate the current source voltage VPCS without coupling to the overdrive voltage generator 130.

Figure 6:
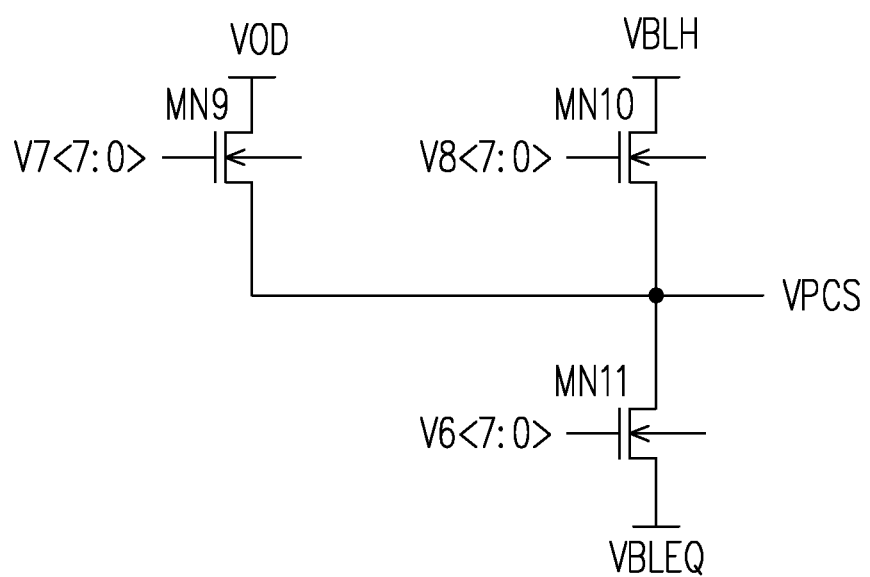
FIG. 6 is a schematic diagram of a current source voltage generator according to an embodiment of the invention.

Referring to FIG. 6, FIG. 6 is a schematic diagram of the current source voltage generator 120 according to an embodiment of the invention. The current source voltage generator 120 includes three N-type transistors MN9, MN10 and MN11, which are respectively controlled by control signals V7<7:0>, V8<7:0> and V6<7:0> to generate the current source voltage VPCS, though the invention is not limited thereto. In detail, the N-type transistor MN9 outputs the overdrive voltage VOD as the current source voltage VPCS according to the control signal V7<7:0>. The N-type transistor MN10 outputs the bit line high voltage VBLH as the current source voltage VPCS according to the control signal V8<7:0. The N-type transistor MN11 outputs the bit line equalization voltage VBLEQ as the current source voltage VPCS according to the control signal V6<7:0>. Detailed timing control is described below.

Figure 7A:
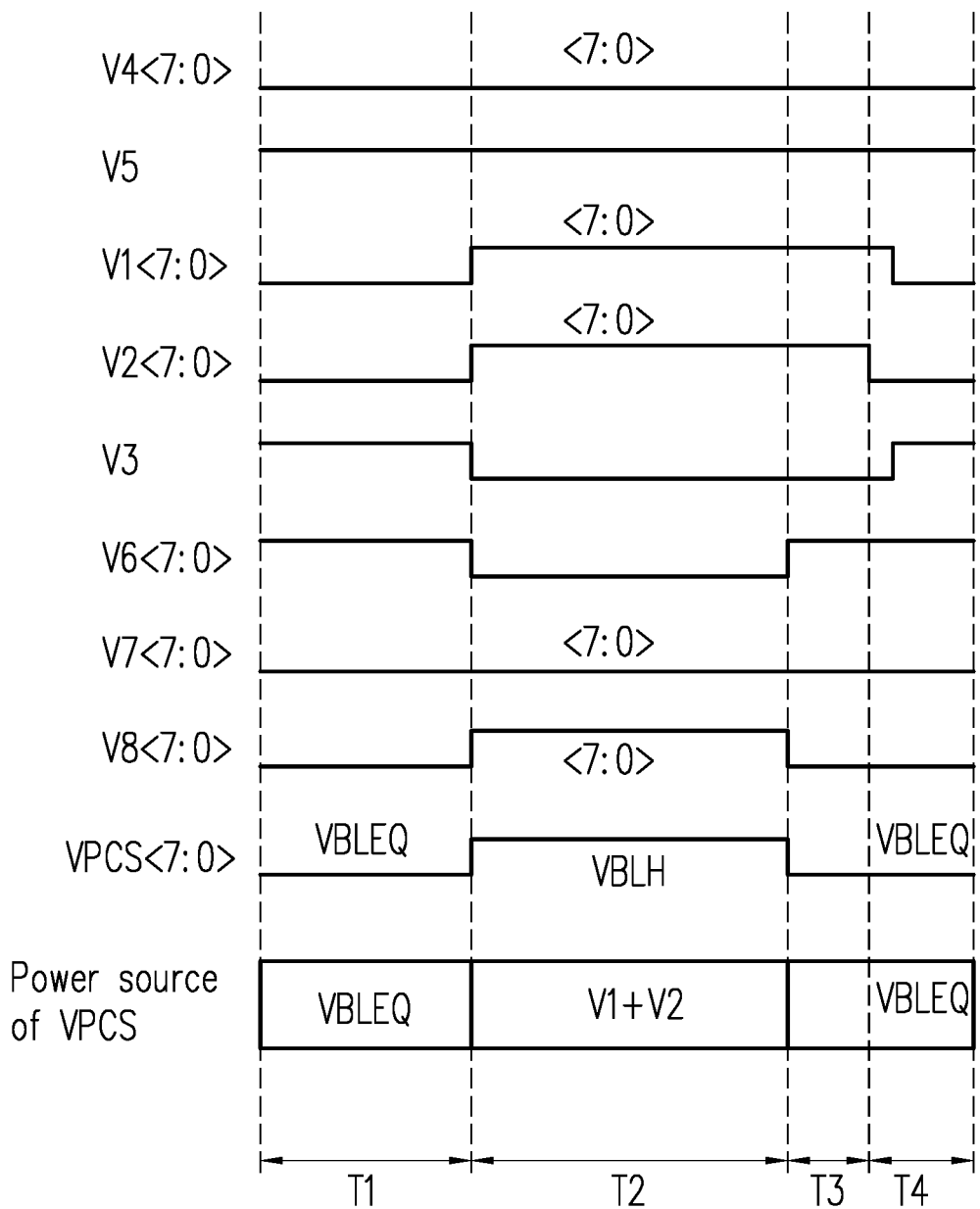
FIG. 7A is a timing diagram of control signals for a bit line high voltage generator and an overdrive voltage generator during a refresh operation in another embodiment of the invention.

Referring to FIG. 7A, before the refresh operation (i.e. a time interval T1), the first standby voltage circuit control signal V3 and the control signal V6<7:0> have a high logic level, and the other controls signals have a low logic level, so that only the first standby voltage circuit 160 generates current consumption for the bit line high voltage VBLH, and the current source voltage generator 120 provides the bit line equalization voltage VBLEQ to the current source voltage VPCS, such that the current source voltage VPCS is approximately equal to the bit line equalization voltage VBLEQ.

During the refresh operation (i.e. a time interval T2), the first standby voltage circuit control signal V3, the control signal V6<7:0> and the control signal V7<7:0> are in the low logic level, and the control signal V8<7:0> of the selected memory bank is in the high logic level, such that the bit line high voltage VBLH serves as the current source voltage VPCS of the selected memory bank. Meanwhile, the first control signal V1<7:0> and the second control signal V2<7:0> are in the high logic level to activate the first voltage generation circuit 140 and the second voltage generation circuit 150 in the bit line high voltage generator 110 to provide current consumption to the current source voltage VPCS through the bit line high voltage VBLH, and now the potential of the current source voltage VPCS is gradually pulled up to the bit line high voltage VBLH from the bit line equalization voltage VBLEQ. Meanwhile, the third control signal V4<7:0> is in the low logic level and the second standby voltage circuit control signal V5 is in the high logic level, so that in the standby state, the overdrive voltage generator 130 (having the charge pump circuit 172) with lower efficiency is turned off, and only the first voltage generation circuit 140 (having the first linear voltage regulator 142) and the second voltage generation circuit 150 (having the switching voltage regulator 152) with higher efficiency are used for providing voltage output, so as to reduce the current consumption of the bit line power supply apparatus 100 during the refresh operation. Moreover, since the first control signal V1<7:0> and the second control signal V2<7:0> are all in the high logic level, by simultaneously using the first voltage generation circuit 140 and the second voltage generation circuit 150 corresponding to all of the memory banks to provide the current consumption for the bit line high voltage VBLH, a voltage drop of the bit line high voltage VBLH may be further decreased. Therefore, in the time interval T2, the bit line high voltage VBLH jointly generated by the first voltage generation circuit 140 and the second voltage generation circuit 150 serves as the current source voltage VPCS.

In a time interval T3, the control signal V6<7:0> returns to the high logic level, such that a potential of the current source voltage VPCS is decreased to about the bit line equalization voltage VBLEQ. In a time interval T4, the second control signal V2<7:0> first returns to the low logic level, and then the first control signal V1<7:0> and the first standby voltage circuit control signal V3 simultaneously return to the low logic level and the high logic level, respectively, and now only the first standby voltage circuit 160 provides some current consumption for the bit line high voltage VBLH.

It should be noted that during the refresh operation, the bit line high voltage generator 110 makes the memory banks to be recharged sequentially. Moreover, in the refresh operation, the overdrive voltage generator 130 is turned off (disabled).

Figure 7B:
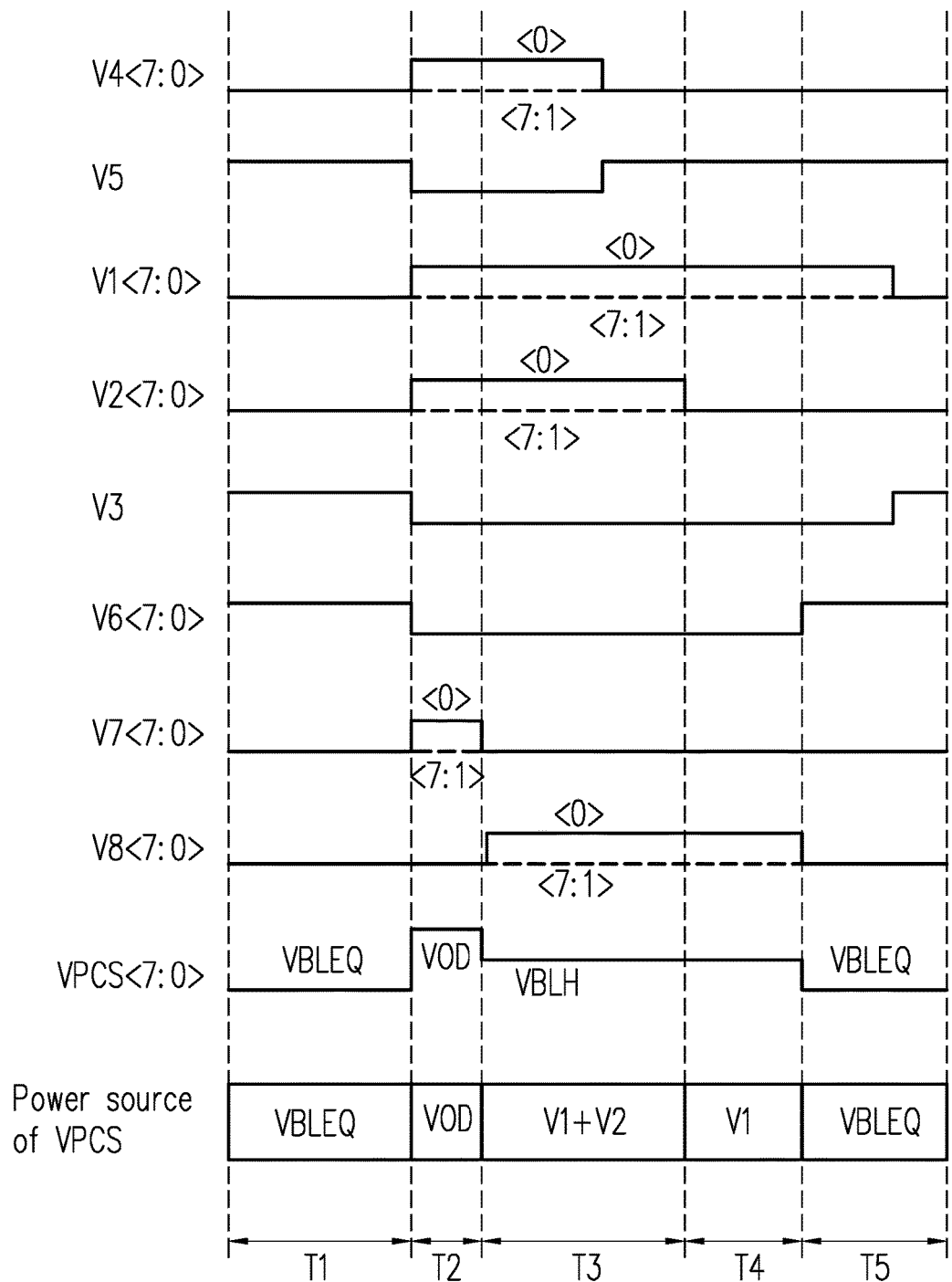
FIG. 7B is a timing diagram of control signals for the bit line high voltage generator and the overdrive voltage generator during a memory bank activation operation in another embodiment of the invention.

As shown in FIG. 7B, before an activation operation of the memory banks (i.e. the time interval T1), the first standby voltage circuit control signal V3 and the second standby voltage circuit control signal V5 are in the high logic level, so that the first standby voltage circuit 160 provides the current consumption for the bit line high voltage VBLH, and the second standby voltage circuit 180 provides the current consumption for the overdrive voltage VOD. Meanwhile, since the control signal V6<7:0> is in the high logic level, the potential of the current source voltage VPCS is about the bit line equalization voltage VBLEQ.

When the activation operation of the memory banks is performed (i.e. the time interval T2), the first control signal V1<7:0>, the second control signal V2<7:0> and the third control signal V4<7:0> are in the high logic level, such that the first voltage generation circuit 140 and the second voltage generation circuit 150 in the bit line high voltage generator 110 and the third voltage generation circuit 170 in the overdrive voltage generator 130 are simultaneously enabled. However, since the control signal V7<7:0> is in the high logic level, and the control signal V8<7:0> is in the low logic level, the overdrive voltage VOD now serves as the current source voltage VPCS, such that the bit line power supply apparatus 100 has a faster random access time in the activation operation.

After the activation operation of the memory banks is performed for a while (i.e. the time interval T3), the control signal V7<7:0> is decreased to the low logic level, and the control signal V8<7:0> is increased to the high logic level, and the bit line high voltage VBLH generated by the first voltage generation circuit 140 and the second voltage generation circuit 150 serves as the current source voltage VPCS. The current consumption caused by the first voltage generation circuit 140 and the second voltage generation circuit 150 is lower than the current consumption caused by the overdrive voltage VOD.

After the sensing amplifier is activated for a period of time (for example, about 70 ns) (i.e. the time interval T4), since the current source voltage VPCS has approached the target value of the bit line high voltage VBLH, in order to further decrease the power consumption, the second control signal V2<7:0> is decreased to the low logic level, and the second voltage generation circuit 150 having the switching voltage regulator 152 is turned off, and now only the first voltage generation circuit 140 having the first linear voltage generator 142 in the bit line high voltage generator 110 provides the power consumption, such that the power consumption is further decreased. Therefore, in the time interval T4, the bit line high voltage VBLH generated by the first voltage generation circuit 140 serves as the current source voltage VPCS.

Moreover, when a switching frequency of the second control signal V2<7:0> is relatively high, a higher ripple is caused on the bit line high voltage VBLH, so that the second control signal V2<7:0> is decreased to the low logic level in advance to reduce the ripple of the bit line high voltage VBLH.

In a time interval T5, the control signal V2<7:0> returns to the high logic level, such that the potential of the current source voltage VPCS is decreased to about the bit line equalization voltage VBLEQ. Then, the first control signal V1<7:0> is decreased to the low logic level to turn off the first voltage generation device 140, and meanwhile the first standby voltage circuit control signal V3 returns to the high logic level. At this moment, only the first standby voltage circuit 160 provides some current consumption for the bit line high voltage VBLH.

Figure 8A:
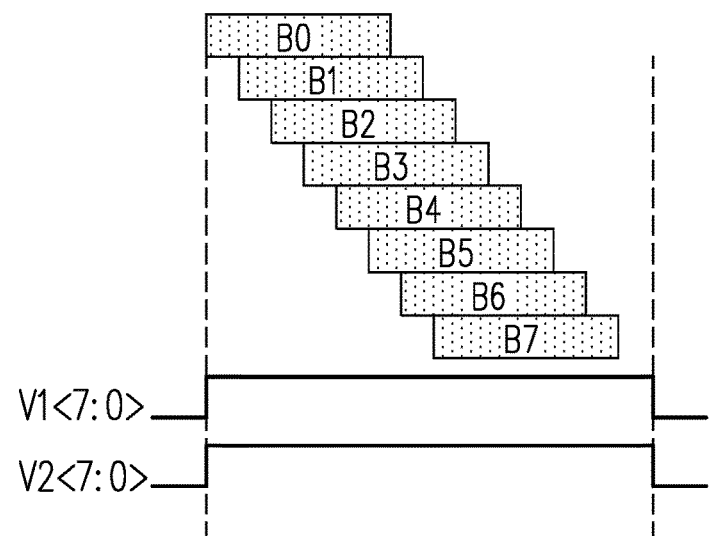
FIG. 8A is a timing diagram of control signals for a first voltage generation circuit and a second voltage generation circuit of a bit line high voltage generator during a refresh operation in another embodiment of the invention.
Figure 8B:
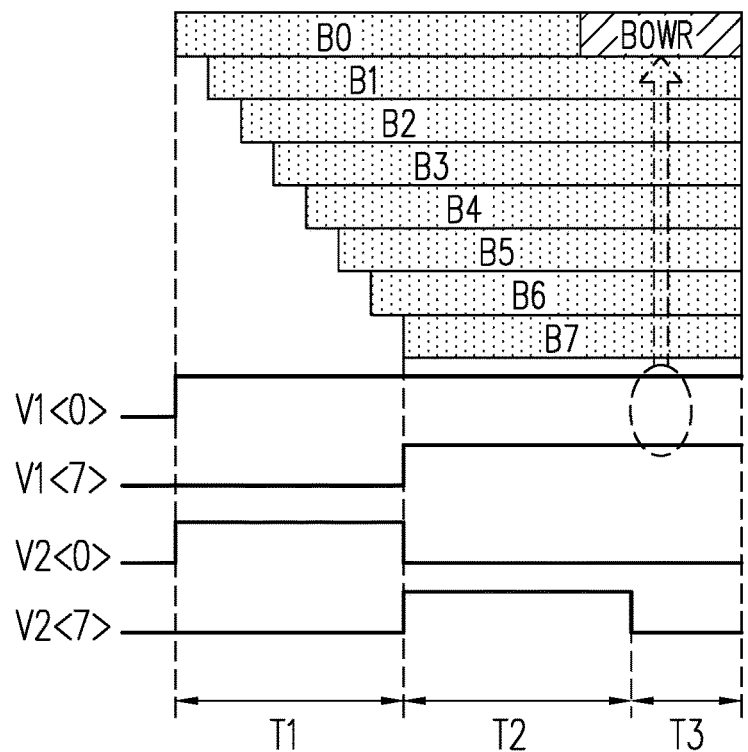
FIG. 8B is a timing diagram of control signals for the first voltage generation circuit and the second voltage generation circuit of the bit line high voltage generator during a memory bank activation operation in another embodiment of the invention.

Referring to FIG. 8A, in the refresh operation, during the period that any memory bank is refreshed, all of the bit line high voltage generators are turned on to sequentially output the bit line high voltages to the memory banks B0-B7 in a full measure. Referring to FIG. 8B, and activation operation of the memory banks B0-B7 is performed, the first control signal V1<0> to the first control signal V1<7> are sequentially increased to the high logic level, and the second control signal V2<0> to the second control signal V2<7> are sequentially increased to the high logic level, such that the first voltage generation circuit 140 and the second voltage generation circuit 150 in the bit line high voltage generator 110 receptively provide a voltage supply to the corresponding memory banks, so as to sequentially write the memory bank B0 to the memory bank B7. However, after the sensing amplifier is activated for a period of time (about 70 ns) (i.e. after the time interval T1 while the second control signal V2<0> is in the high logic level, or after the time interval T2 while the second control signal V2<7> is in the high logic level), the second control signals V2<7:0> are sequentially decreased to the low logic level to turn off the second voltage generation circuit 150, such that only the first voltage generation circuit 140 provides voltage, thereby decreasing the current consumption of the bit line power supply apparatus 100. For example, after the time interval T1, in a write period B0WR of the memory bank B0, only the first voltage generation circuit 140 provides voltage.

It should be noted that in the activation operation, when any of the memory banks is activated, the overdrive voltage generator 130 is turned on for a period of time (for example, about 70 ns) to provide a higher voltage and larger current consumption in a short time. After the overdrive voltage generator 130 is turned on for a period of time, a plurality of the bit line high voltage generators 110 may be simultaneously turned on to output in higher efficiency.

In summary, in the invention, the bit line power supply apparatus includes a bit line high voltage generator and an overdrive voltage generator, where the bit line high voltage generator has a linear voltage regulator and a switching voltage regulator, and the overdrive voltage generator has a charge pump circuit. In the refresh operation, the overdrive voltage generator with lower efficiency is turned off, and only the bit line high voltage generator with higher efficiency is used for outputting, so as to reduce the current consumption and voltage drop during the refresh operation. In the activation operation, the bit line high voltage generator and the overdrive voltage generator are simultaneously turned on, and after a short period of time, the overdrive voltage generator is first turned off, and after a period of time, the switching voltage regulator is turned off, such that the activation operation has a fast random access time and smaller current consumption, and a size requirement of the voltage regulator of the bit line high voltage and a voltage drop of the bit line high voltage are decreased.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A bit line power supply apparatus, adapted to a memory, and comprising:
    a bit line high voltage generator, configured to generate a bit line high voltage, and comprising:
        a first voltage generation circuit, comprising:
            a first sensor, receiving a first control signal, and configured to compare a first reference voltage with the bit line high voltage to generate a first sensing voltage when the first sensor is enabled according to the first control signal, wherein a power supply voltage of the first sensor is a first voltage; and
            a first linear voltage regulator, coupled to the first sensor, and configured to perform linear adjustment on the first sensing voltage to generate a first output voltage, wherein a power supply voltage of the first linear voltage regulator is a second voltage;
        a second voltage generation circuit, coupled in parallel with the first voltage generation circuit, and comprising:
            a second sensor, receiving a second control signal, and configured to compare the first reference voltage with the bit line high voltage to generate a second sensing voltage when the second sensor is enabled according to the second control signal, wherein a power supply voltage of the second sensor is a third voltage; and
            a switching voltage regulator, coupled to the second sensor, and configured to perform switching adjustment according to the second sensing voltage to generate a second output voltage, wherein a power supply voltage of the switching voltage regulator is the second voltage,
    wherein the bit line power supply apparatus combines the first output voltage and the second output voltage to generate the bit line high voltage, the first voltage is greater than the third voltage, and the third voltage is greater than the second voltage.

2. The bit line power supply apparatus as claimed in claim 1, wherein in a refresh operation, the bit line high voltage generator makes a plurality of memory banks to be recharged sequentially.

3. The bit line power supply apparatus as claimed in claim 1, wherein the first sensor comprises a first operational amplifier, a first input terminal of the first operational amplifier receives the first reference voltage, a second input terminal receives the bit line high voltage, the first operational amplifier is enabled according to the first control signal, and compares the first reference voltage with the bit line high voltage to generate the first sensing voltage.

4. The bit line power supply apparatus as claimed in claim 3, wherein the first linear voltage regulator comprises:
    a switch, coupled between an output terminal of the first operational amplifier and an output terminal of the first linear voltage regulator, and turned on or turned off according to an enable signal, wherein the enable signal is generated according to the first control signal;
    a resistance-capacitance string, coupled between the output terminal of the first operational amplifier and the output terminal of the first linear voltage regulator; and an output stage, coupled to the output terminal of the first operational amplifier, receiving the first sensing voltage, and generating the bit line high voltage according to the first sensing voltage, wherein a power supply voltage of the output stage is the second voltage.

5. The bit line power supply apparatus as claimed in claim 3, wherein the second sensor further comprises a second operational amplifier, the second operational amplifier is enabled according to the second control signal, and compares the first reference voltage with the bit line high voltage to generate the second sensing voltage.

6. The bit line power supply apparatus as claimed in claim 5, wherein the switching voltage regulator comprises:

a switch, coupled between an output terminal of the second operational amplifier and the third voltage, and turned on or turned off according to an enable signal;

a pull-up switch, having a first terminal coupled to the third voltage, and a gate coupled to the output terminal of the second operational amplifier;

a reference current generator, coupled to a second terminal of the pull-up switch to generate a reference current;

a buffer, coupled to the second terminal of the pull-up switch, and outputting a buffer voltage;

a level shifter circuit, coupled to the buffer to receive the buffer voltage, and shifting a voltage of the buffer voltage to generate a gate control voltage; and an output stage, receiving the gate control voltage, and generating the second output voltage according to the gate control voltage, wherein a power supply voltage of the output stage is the second voltage, and the enable signal is generated according to the second control signal.

7. The bit line power supply apparatus as claimed in claim 1, wherein the bit line high voltage generator further comprises:

a first standby voltage circuit, coupled in parallel with the first voltage generation circuit and the second voltage generation circuit, and configured to generate the bit line high voltage according to the first reference voltage and a first standby voltage circuit control signal.

8. The bit line power supply apparatus as claimed in claim 7, wherein the first standby voltage circuit in the bit line high voltage generator comprises:

a third sensor, enabled according to the first standby voltage circuit control signal, and configured to compare the first reference voltage and the bit line high voltage to generate a third sensing voltage, wherein a power supply voltage of the third sensor is the second voltage; and a second linear voltage regulator, coupled to the third sensor, and configured to perform linear adjustment on the third sensing voltage to generate the bit line high voltage, wherein a power supply voltage of the second linear voltage regulator is the second voltage.

9. The bit line power supply apparatus as claimed in claim 8, further comprising:

a current source voltage generator, coupled to the bit line high voltage generator, and configured to generate a current source voltage according to the bit line high voltage.

10. The bit line power supply apparatus as claimed in claim 9, further comprising:

an overdrive voltage generator, having a third voltage generation circuit, and configured to generate an overdrive voltage according to a second reference voltage and a third control signal, wherein the current source voltage generator is further coupled to the overdrive voltage generator, and generates the current source voltage according to the bit line high voltage or the overdrive voltage.

11. The bit line power supply apparatus as claimed in claim 10, wherein in a refresh operation, the overdrive voltage generator is in a turn-off state.

12. The bit line power supply apparatus as claimed in claim 10, wherein in an activation operation, when a memory bank is activated, the overdrive voltage generator is turned on for a time interval, and after the overdrive voltage generator is turned on for the time interval, a plurality of the bit line high voltage generators are simultaneously turned on.

13. The bit line power supply apparatus as claimed in claim 10, wherein the third voltage generation circuit comprises:

a fourth sensor, configured to compare the second reference voltage and the overdrive voltage to generate a fourth sensing voltage according to the third control signal, wherein a power supply voltage of the fourth sensor is the third voltage; and a charge pump circuit, coupled to the fourth sensor, and configured to generate the overdrive voltage according to the fourth sensing voltage, wherein a power supply voltage of the fourth sensor is the third voltage, and a power supply voltage of the charge pump circuit is the second voltage.

14. The bit line power supply apparatus as claimed in claim 13, wherein the overdrive voltage generator further comprises:

a second standby voltage circuit, coupled in parallel with the third voltage generation circuit, and configured to generate the overdrive voltage according to the second reference voltage and a second standby voltage circuit control signal.

15. The bit line power supply apparatus as claimed in claim 14, wherein the second standby voltage circuit comprises:

a fifth sensor, configured to compare the second reference voltage and the overdrive voltage to generate a fifth sensing voltage according to the second standby voltage circuit control signal, wherein a power supply voltage of the fifth sensor is the third voltage; and a third linear voltage regulator, coupled to the fifth sensor, and configured to generate the overdrive voltage according to the fifth sensing voltage, wherein a power supply voltage of the third linear voltage regulator is the third voltage.

* * * * *